United States Patent [19]

Walls

[11] 4,351,895

[45] Sep. 28, 1982

[54] DELETION FLUID FOR POSITIVE PRINTING PLATES

[75] Inventor: John E. Walls, Annandale, N.J.

[73] Assignee: American Hoechst Corporation, Somerville, N.J.

[21] Appl. No.: 312,450

[22] Filed: Oct. 19, 1981

[51] Int. Cl.³ .............................................. G03C 5/00
[52] U.S. Cl. .................... 430/331; 252/154; 252/544; 134/38; 430/309; 430/326; 430/329
[58] Field of Search ............... 430/326, 331, 302, 309, 430/329, 325, 449, 466, 486, 493; 252/544, 154; 134/38

[56] References Cited

U.S. PATENT DOCUMENTS

| | | | |
|---|---|---|---|
| 3,392,019 | 7/1968 | Barnes et al. | 430/456 |
| 3,455,688 | 7/1969 | Adams et al. | 430/309 |
| 3,475,171 | 10/1969 | Alles | 430/331 |
| 3,481,877 | 12/1969 | Moll | 252/79.5 |
| 3,707,373 | 12/1972 | Martinson et al. | 430/331 |
| 4,141,733 | 2/1979 | Guild | 430/331 |
| 4,246,843 | 1/1981 | Garrett | 101/451 |
| 4,267,260 | 5/1981 | Miura et al. | 430/302 |

*Primary Examiner*—Mary F. Downey
*Attorney, Agent, or Firm*—Richard S. Roberts

[57] ABSTRACT

A deletion fluid for positive working printing plates which is capable of removing unwanted, unexposed portions of a photosensitive coating on a substrate without detrimentally affecting the surface of said substrate. Said deletion fluid comprises an aqueous solution of a gum, an aliphatic alcohol, acetate or ether solvent, an amine desensitizing component and a thixotropic agent.

10 Claims, No Drawings

DELETION FLUID FOR POSITIVE PRINTING PLATES

BACKGROUND OF THE INVENTION

The present invention relates to positive working, photosensitive elements such as lithographic printing plates. More particularly, the invention relates to deletion fluids for such plates which are capable of removing unwanted photosensitive coatings from the surface of such plates.

Positive working lithographic printing plates are commonly formed by coating a substrate, such as an aluminum sheet with an aluminum oxide or anodic surface, with a photosensitive composition. Such composition generally comprises a quinone diazide photosensitizer in admixture with an alkali soluble resin such as a novolak.

Exposure of the composition through a photographic mask or positive flat to actinic radiation results in a solubility differential between the exposed and unexposed areas such that treatment with an appropriate developer results in removal of the radiation struck areas and retention of the desired image areas on the support. It is believed that such exposure decomposes the diazo structure in the radiation struck areas to form the free carboxylic acid group, thereby rendering the exposed areas soluble in akaline developer solutions. The developer solutions which are employed for this purpose can be aqueous solutions. Typical examples of alkaline developer solutions utilized heretofore in development of quinone diazide compositions include solutions of sodium hydroxide, lithium hydroxide, ammonium hydroxide, potassium hydroxide, sodium carbonate, sodium silicate or sodium phosphate.

Occasionally, after development, it is noticed that the plate possesses some imperfections. That is, some areas which should have been exposed and removed with the developer were actually not removed, or it is desired to remove some unexposed image area in a composition change. Clearly, the plate cannot be partially re-exposed to render such areas removable by the developer since inevitably some desired image areas would also be removed. It then becomes necessary to use a deletion fluid which is capable of being locally applied to dissolve and remove such undesired, non-alkali soluble areas.

There are many compositions which have been tried as deletion fluids heretofore, however, each has significant drawbacks. Some attack the underlying substrate, others do not desensitive the uncovered plate areas and thus attract ink during printing.

Generally, there are six requirements for a good deletion fluid. They are as follows:

(a) All coating components must be removed both quickly and easily.

(b) There is substantially no attack on the underlying substrate (i.e., dissolution of the anodic film). A neutral pH is preferred.

(c) The substrate must be hydrophilic after the deletion so as to be capable of giving clean reproductions, and, in the event of an image set-in, must provide acceptable adhesion.

(d) The product must be sufficiently viscous so as not to run into adjacent image areas. Further, it must be thixotropic so as to flow well in application.

(e) The solvent system of the product has to be non-toxic, have a high-boiling point, be miscible with water and be a solvent for all ingredients in the coatings. It would also be desirable to have an odorless system.

(f) The area of treatment must be easily rinsed of all deletion fluid and loosened coating.

SUMMARY OF THE INVENTION

The present invention is directed to a deletion fluid for positive working photographic elements which comprises an aqueous solution containing:

(a) a gum which is soluble both in water and a compound selected from the group consisting of one or more aliphatic alcohols, acetates and ethers; and (b) at least one compound selected from the group consisting of cyclohexanone, and compounds having the formula:

$$R_1(CH_2CH_2O)_nR_2$$

where
$n = 1-10$
$R_1 = CH_3O, CH_3(CH_2)_mO$, where $m = 1-3$
$R_2 = R_1, -OH, CH_3COO-$ (c) a thixotropic agent capable of creating weak hydrogen bonding between itself and the hydroxyl groups of said gum; and (d) a desensitizing agent selected from the group consisting of morpholine, aniline, chloro-aniline, bromo-aniline, methyl-aniline and compounds having the formula:

$$R_3-N\begin{matrix}R_1\\R_2\end{matrix}$$

where
$R_1 = H, -CH_2CH_2OH, -CH_2CH_3$
$R_2 = R_1$
$R_3 = R_1, (CH_2)_nNH_2$ ($n = 1-6$)

DETAILED DESCRIPTION OF THE PREFERRED EMBODIMENT

As heretofore described, the present invention contains a gum, an aliphatic alcohol or ether, a thixotropic agent and a desensitizing compound, plus water.

The gum component is preferably a cellulosic gum or a water soluble polymer which is soluble both in water and aliphatic alcohols, acetates and ethers. The preferred compound is carboxy methyl hydroxy ethyl cellulose.

Other suitable gums are hydroxy ethyl isopropyl cellulose, carboxy methyl cellulose, methyl cellulose, polyvinyl methyl ether maleic anhydride copolymer, polyvinyl pyrrolidone, polyvinyl alcohol and polyvinyl alcohol/acetate copolymer.

The gum preferably comprises from about 0.25 to about 8% of the deletion fluid. A more preferred range is from about 0.5% to about 5%. A most preferred range is from about 0.5% to about 3%. The gum serves as a thickener and a hydrophilizing agent to prevent toning and scumming.

The composition also contains a water miscible solvent, preferably one having a high boiling point. The preferred solvent is triethylene glycol dimethyl ether. It is an excellent solvent for all of the coating ingredients and it has a low vapor pressure and high boiling point which allows it to set for extended periods of time on a plate without evaporation. Further, it is miscible with water which means a fully stable solution is realized. Other solvents which may be used are: tetraethylene glycol mono- and di-methyl ether, diethylene glycol mono- and di-methyl ether, ethylene glycol mono- and di-methyl ether, the acetates of all the above as a methyl ether acetate or diacetate, the mono- and di-ethers using ethyl, propyl and butyl substitutions. These generally have the formula:

$$R_1(CH_2CH_2O)_nR_2$$

where
 n=1–1$\phi$, preferably 1–4
 $R_1=C_3O, CH_3(CH_2)_mO$, where m=1–3
 $R_2=R_1,—OH, CH_3COO—$
Another useful solvent is cyclohexanone.

The solvent serves to dissolve the unwanted photosensitive coating composition. It is preferably present in the amount of from about 20% to 80% by weight of the deletion fluid. More preferably the quantity ranges from 40% to 70% and most preferably from 55% to 65%.

The delation fluid further contains a thixotropic agent to increase its viscosity to the desired level by the formation of weak hydrogen bonding between itself and the gum composition. This feature is advantageous in controlling the amount and placement of the deletion fluid to a plate. This ingredient adds texture, lubricity and viscosity to the fluid for ease of handling. Such hydrogen bonding easily breaks when rubbed on the plate site with a swab. The most preferred thixotropic agent is fumed silicon dioxide. It is preferably present in an amount of from about 1% to 12% by weight of the deletion fluid. More preferably it is present in an amount of from about 3% to about 8%, most preferably 4% to 6%.

Finally, to assure full desensitization of the photosensitive composition, an additive is used for this purpose. Suitable desensitizing agents include morpholine, aniline, chloro-aniline, bromo-aniline, methyl-aniline and compounds having the formula:

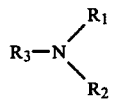

where
 $R_1=H,—CH_2CH_2OH,—CH_2CH_3$
 $R_2=R_1$
 $R_3=R_1,(CH_2)_nNH_2(n=1–6)$

The preferred compound is diethanolamine. The desensitizing agent is preferably present in the deletion fluid in an amount of from about 0.5% to about 6% by weight. More preferably the amount ranges from about 0.5% to about 4%, most preferably 0.7% to 2%. The balance of the deletion fluid is water.

In operation, a positive working photosensitive composition comprising a quinone diazide and a novolak resin is coated on the surface of an anodized aluminum sheet. The thusly formed plate is exposed through a photographic negative to ultraviolet radiation and developed with an aqueous alkali solution and well rinsed.

The plate is then treated with a positive finisher to neutralize the surface or with any gum or dextrin base finisher. At this point the plate is "staged". This is where the deletion fluid is used to remove any unwanted image. Generally, a cotton-tip swab is used to do the deletion. Any area to be deleted should be immediately removable in the deletion fluid, i.e., preferably under five seconds. The plate is water-rinsed to remove deletion fluid and the loosened coating. The plate is then finished with a thermal protection coating and baked to cross-link the binder resin. A treatment of 450° for five minutes is sufficient to produce an extremely tough image. After such cross-linking, it is impossible to make any deletion.

The following non-limiting illustrative examples demonstrate the principle of the present invention:

EXAMPLE 1

An aluminum plate is degreased in a conventional alkaline aqueous degreasing solution and subsequently roughened using known mechanical methods. The roughened plate is then anodized using DC current and a standard acid bath to result in an oxide weight of approximately 3.0 g/M$^2$. The roughened, anodized substrate is next rendered hydrophilic using a process as described in U.S. Pat. No. 4,153,461. The substrate as detailed is coated with a positive acting coating solution having the composition described in U.S. Pat. No. 3,867,147. With a conventional mercury-vapor UV light source exposure unit, the described plate is exposed properly so as to result in a "knock-out"; i.e., clear, step two using a 21 step continuous tone exposure guide after development. Development is effected with a standard positive alkaline aqueous developer. After development the plate is well rinsed and neutralized with a mild acid solution so as to stop the action of any residual alkaline material.

An area of the positive plate has as section consisting of several lines which are to be deleted. Deletion is first attempted using a commercially available composition. The material used for image removal is XTAL-CHROME Medallion "B" (by PDI, Racine, Wis.). After deletion, the plate is again treated with an alkaline aqueous developer and then well rinsed.

The full plate is then coated and buffed using a thermal protecting solution after which the plate is heat treated at 450° F. for 10 minutes to thermoset the resins in the image area. The baked plate is then rinsed to remove the coating used for thermal protection. Finally the plate is finished with a solution described in U.S. Pat. No. 4,213,887 to preserve the background hydrophilicity.

The thusly prepared plate is run on a conventional offset printing press. The area that was treated with the deletion fluid demonstrated toning for the next 500 copies. Such an event would be considered commercially unacceptable.

EXAMPLE 2

In a like manner, a plate is prepared, exposed and developed as described in Example #1 after which the section to be deleted is treated with the following composition for image removal:
 53.0 parts cyclohexanone
 2.0 parts monoethanol amine
 7.0 parts polyvinyl pyrrolidone
 4.5 parts fumed silicone dioxide
 33.5 parts water The resulting mixture is a thick clear solution having a viscosity of 80,000 cps. Using a cotton-tip swab, the area to be deleted is treated. The plate is then processed and baked as described in example #1 and run on an offset printing press. The area having the image removed rolls up clean in the same number of impressions as did the balance of the background which is twelve impressions. Such an event is considered acceptable.

EXAMPLE 3

In like manner, a plate is prepared, exposed and developed as detailed in example #1 after which the image area to be removed is treated with the same composition used in example #2 except that the monoethanol amine is omitted.

The plate prepared as detailed in example #1 and treated with said deletion solution is checked for roll-up. Although the image is fully removed, insufficient desensitization is to be observed in the form of a light toning in what should be a clean background. Such an event is considered unacceptable.

EXAMPLE 4

A plate prepared before and after deletion as described in example #1 was treated with a solution having the following formula:
29.9 parts water
0.7 parts carboxy methyl hydroxy ethyl cellulose
62.6 parts triethylene glycol dimethyl
1.6 parts diethanol amine
5.2 parts fumed silicon dioxide The resulting viscosity is 320,000 cps. The plate treated with this solution gives full image removal and a background that is clean immediately upon roll-up.

EXAMPLE 5

A plate is prepared in similar manner as described in example #4 except that the triethylene glycol dimethyl ether is replaced by ethylene glycol monomethyl ether. As in example #1, a plate is likewise prepared and treated. Due to the high volatility of the solvent, the area deleted is not fully removed which results in an unacceptably toned background.

What is claimed is:

1. A deletion fluid for positive working photographic elements which comprises an aqueous solution containing:
   (a) a gum which is soluble both in water and a compound selected from the group consisting of one or more aliphatic alcohols, acetates and ethers; and
   (b) at least one compound selected from the group consisting of cyclohexanone, and compounds having the formula:

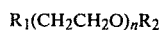

where
   n = 1-10
   $R_1 = CH_3O, CH_3(CH_2)_mO$, where m = 1-3
   $R_2 = R_1, -OH, CH_3COO-$ (c) a thixotropic agent capable of creating weak hydrogen bonding between itself and the hydroxyl groups of said gum; and
   (d) a desensitizing agent selected from the group consisting of morpholine, aniline, chloro-aniline, bromo-aniline, methyl-aniline and compounds having the formula:

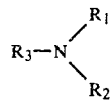

where
   $R_1 = H, -CH_2CH_2OH, -CH_2CH_3$
   $R_2 = R_1$
   $R_3 = R_1, (CH_2)_nNH_2 (n = 1-6)$.

2. The deletion fluid of claim 1 wherein said gum comprises one or more compounds selected from the group consisting of carboxy methyl hydroxy ethyl cellulose, hydroxy ethyl isopropyl cellulose, carboxy methyl cellulose, methyl cellulose, polyvinyl methyl ether maleic anhydride copolymer, polyvinyl pyrrolidone, polyvinyl alcohol and polyvinyl alcohol/acetate copolymer.

3. The deletion fluid of claim 1 wherein said thixotropic agent is a composition comprising fumed silicon dioxide.

4. The deletion fluid of claim 2 wherein said thixotropic agent is a composition comprising fumed silicon dioxide.

5. The deletion fluid of claim 1 wherein said gum comprises carboxy methyl hydroxy ethyl cellulose, said compound (b) comprises triethylene glycol dimethyl ether, said thixotropic agent comprises fumed silicon dioxide, and said desensitizing agent comprises diethanolamine.

6. The deletion fluid of claim 1 wherein said gum is present in an amount of from about 0.25% to about 8% by weight.

7. The deletion fluid of claim 1 wherein said compound (b) is present in an amount of from about 20% to about 80% by weight.

8. The deletion fluid of claim 1 wherein said thixotropic agent is present in an amount of from about 1% to about 12% by weight.

9. The deletion fluid of claim 1 wherein said desensitizing agent is present in an amount of from about 0.5% to about 6% by weight.

10. The deletion fluid of claim 1, 2, 3, 4, or 5 wherein said gum is present in an amount from about 0.25% to about 8% by weight; said compound (b) is present in an amount of from about 20% to about 80% by weight; said thixotropic agent is present in an amount of from about 1% to about 12% by weight; and said desensitizing agent is present in an amount of from about 0.5% to about 6% by weight.

* * * * *